United States Patent
Reza

(10) Patent No.: US 12,068,216 B1
(45) Date of Patent: Aug. 20, 2024

(54) MULTICHANNEL TRANSISTOR WITH IMPROVED GATE CONFORMATION

(71) Applicants: National Technology & Engineering Solutions of Sandia, LLC, Albuquerque, NM (US); Raytheon Company, Waltham, MA (US)

(72) Inventor: Shahed Reza, Albuquerque, NM (US)

(73) Assignees: National Technology & Engineering Solutions of Sandia, LLC, Albuquerque, NM (US); Raytheon Company, Waltham, MA (US)

( * ) Notice: Subject to any disclaimer, the term of this patent is extended or adjusted under 35 U.S.C. 154(b) by 428 days.

(21) Appl. No.: 17/691,970

(22) Filed: Mar. 10, 2022

Related U.S. Application Data

(60) Provisional application No. 63/257,953, filed on Oct. 20, 2021.

(51) Int. Cl.
| | |
|---|---|
| *H01L 29/66* | (2006.01) |
| *H01L 23/367* | (2006.01) |
| *H01L 29/423* | (2006.01) |
| *H01L 29/778* | (2006.01) |
| *H01L 29/20* | (2006.01) |

(52) U.S. Cl.
CPC ...... *H01L 23/367* (2013.01); *H01L 29/42316* (2013.01); *H01L 29/7786* (2013.01); *H01L 29/2003* (2013.01)

(58) Field of Classification Search
CPC ............. H01L 23/367; H01L 29/42316; H01L 29/7786
See application file for complete search history.

(56) References Cited

U.S. PATENT DOCUMENTS

| | | | |
|---|---|---|---|
| 7,763,939 B2 | 7/2010 | Leibiger | |
| 10,170,611 B1* | 1/2019 | Tang | .................... H01L 29/7783 |
| 2013/0214330 A1* | 8/2013 | Briere | ................. H01L 29/7788 |
| | | | 257/194 |
| 2013/0299878 A1* | 11/2013 | Briere | ................... H01L 29/778 |
| | | | 257/288 |
| 2023/0369392 A1* | 11/2023 | Nakano | ............... H01L 29/0619 |

* cited by examiner

*Primary Examiner* — Thao P Le
(74) *Attorney, Agent, or Firm* — Kevin W. Bieg; Martin I. Finston

(57) ABSTRACT

A multichannel transistor is provided. In the transistor, a plurality of gate fingers overlie a substrate and extend laterally across the substrate from a gate manifold. The gate manifold has a curved edge, and each of the gate fingers projects radially from the curved manifold edge.

9 Claims, 5 Drawing Sheets

MULTICHANNEL TRANSISTOR WITH IMPROVED GATE CONFORMATION

CROSS-REFERENCE TO RELATED APPLICATION

This application claims priority to U.S. Provisional Application Ser. No. 63/257,953, filed Oct. 20, 2021 under the title, "MULTICHANNEL TRANSISTOR WITH IMPROVED GATE CONFORMATION," the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

FIELD OF THE INVENTION

This invention relates to power transistors, and more particularly to high electron mobility transistors (HEMTs).

ART BACKGROUND

Over the last decade, solid-state devices have become increasingly prominent in high voltage and high power electronics. This is mainly attributable to advances in nitride based device technologies such as high electron mobility transistor (HEMT) technology based on the material system of aluminum gallium nitride (AlGaN) and gallium nitride (GaN).

GaN and AlGaN-based HEMTs are attractive for high power applications due to their material properties including high electron saturation velocity, high thermal conductivity, wide bandgap, and high critical electric field. These attractive material properties enable GaN-based integrated circuits to handle higher power per unit chip area than other conventional technologies, such as silicon.

However, there are still challenges relating to device performance and reliability due to high temperatures caused by heating at high power densities. High power devices typically have multiple channels or, equivalently, multiple gate fingers, and the heat is dissipated parallel to the gate fingers within the channel. The innermost gate fingers tend to reach the highest temperatures because the heat flow is confined by the gate fingers lying on either side. This temperature rise can be alleviated to some extent by increasing the spacing between adjacent gates or by segmenting the channel to distribute the heat sources over a larger area. However, these solutions also increase the device area, which may undesirably reduce the power per unit area (which is an important figure of merit for power transistor applications). This is especially critical for the technologies with high wafer cost, such as the GaN technology.

Increasing the total effective device periphery (i.e., the total gate width cumulated over all gate fingers) offers a viable approach for maximizing device power. For example, the individual gate fingers can be made wider. However, this would incur penalties in increased device area as well as greater gate inductance and resistance. For radio frequency (RF) devices in particular, these penalties might not be tolerable.

The other known method of increasing device periphery is to add more gate fingers. This would also increase the device area, and it would incur further penalties due to the gate manifold (also referred to as the gate "feed") in multiple-channel devices. That is, the gate manifold adds inductance, and due to disparities among its various branches, it also creates phase mismatch among the gate fingers.

Thus, new designs are still needed for high-voltage and high-power transistors that can reduce channel temperatures in devices without sacrificing power density or high-frequency performance.

SUMMARY OF THE INVENTION

We have found such a design. In our design, the gate fingers of the transistor overlie a substrate and extend laterally from the gate manifold across a device mesa defined in the substrate. The substrate has an active area, which we define as the substrate region adjacent to the gate fingers. At least three of the gate fingers extend across the active area with a meandering shape, i.e., a shape that comprises at least one arc.

Each finger has a respective propagation delay (or, equivalently, phase delay) from a common signal injection point within the manifold to the end of the finger distal the manifold. Here, we refer to a signal injection point common to all of the fingers as a "foot" of the gate manifold.

One advantage of the present invention is that suitable meandering shapes are able to equalize the phase delays of the various gate fingers by equalizing their effective lengths. If the signal propagation velocity is the same in all of the fingers, the effective length is the geometrical length of the finger as measured from the foot of the gate manifold. If different fingers have different propagation velocities (due, for example, to different amounts of inductance or capacitance per unit length), then the effective length is the geometrical length times a weighting factor inversely proportional to the propagation velocity, as those skilled in the art will understand. In this regard, effective lengths are "substantially equal" if they are equal to within 1%.

The design of the gate pad or gate manifold affects the path length to the gate fingers. In a conventional T-shaped gate manifold, for example, the size of the gate pad increases with the number of gate fingers. This will cause inequalities in the lengths of the signal paths to the various gate fingers. But additional pathlength can add inductance, and it can also cause mismatches in phase among different gate fingers. Both of these factors can impair high-frequency device performance.

To address this problem, we have developed a new radial design for the gate manifold. In our new design, the signal pathlengths to the respective fingers can be equalized.

Accordingly, the present invention relates to a transistor comprising a substrate having an active area, a gate manifold formed on the substrate, and three or more gate fingers extending across the active area from the gate manifold. The gate manifold has a curved edge, and each of the gate fingers projects radially from the curved manifold edge.

In embodiments, at least one of the three or more gate fingers has a meandering shape that comprises at least one arc. In embodiments, all of the three or more gate fingers may have meandering shapes. In embodiments, each of the meandering shapes comprises at least one arc, which may, e.g., be a sinusoidal arc.

In embodiments, the meandering shape of at least two gate fingers comprises a plurality of arcs described about a curved central course.

In various embodiments, one or more of the sinusoidal arcs may be modulated in amplitude, in frequency, or in both amplitude and frequency.

In embodiments, each of the gate fingers has an effective length from a foot of the gate manifold to a finger end distal to the gate manifold, and all of the three or more gate fingers have substantially the same effective length.

DETAILED DESCRIPTION

Figure 1A:
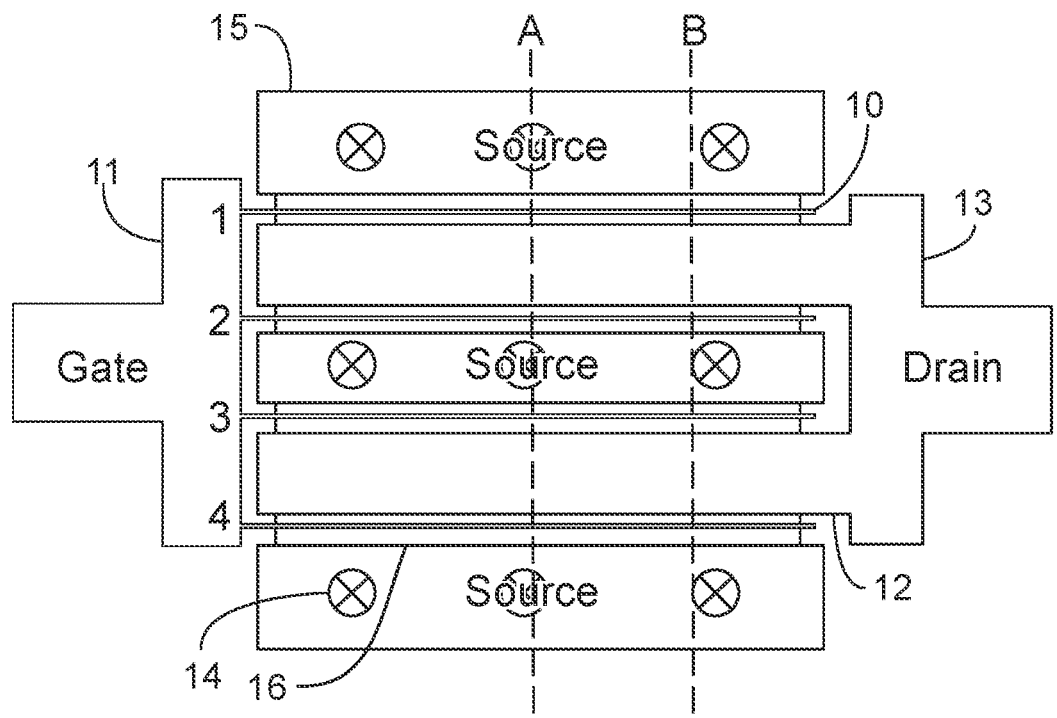
FIG. 1A is a notional plan view of an example AlGaN/GaN HEMT of the prior art, in a configuration having multiple gate fingers. Reference numerals that call out elements of FIG. 1A are repeated in subsequent figures to call out corresponding elements.

FIG. 1A is a notional plan view of an example AlGaN/GaN HEMT of the prior art, in a configuration having multiple gate fingers. In the example, there are four gate fingers 10, labeled from 1 to 4, projecting from gate manifold 11. Also shown are two drain fingers 12 connected to drain manifold 13, and a plurality of vias 14 is shown connecting the source 15 to the backside ground plane. As shown in the figure, the gate is fed only from the manifold side, and the distal ends of the gate fingers remain open.

It should be noted in this regard that although the invention will be described in an illustrative embodiment based on the technology of AlGaN/GaN HEMTs, that technology is offered merely as a non-limiting example. It is contemplated that the principles to be described below can be advantageously applied to other kinds of transistors and to transistors fabricated in other material systems. Hence the scope of the invention should not be understood as restricted to HEMTs, to GaN technology, or even to technologies based on III-V materials generally. Rather, the ideas presented here are more generally applicable to technologies for any kind of transistor having a multichannel layout.

As is well known in the field of CMOS devices, the drain current is proportional to the width of the active region, divided by the length of the channel from source to drain. For devices with a constant channel length, the area of the active region is equal to the channel length times the periphery of the device. The periphery is the gate width, time the total number of gates.

In the device of FIG. 1A, for example, each of the four gates extends in a straight line from left to right across the device mesa from the gate manifold. In this example, the gate width is the straight-line distance across the device mesa 16, and the device periphery is four times that value.

For the reason stated above, the total periphery determines the current-carrying capability of the device. Because the current-carrying capability is an important figure of merit, a desirable objective of any design modification is to maintain (or even to increase) the total periphery.

Two broken lines, labeled "A" and "B", are included in FIG. 1A. These are cut-lines. Each cut-line marks the intersection of the plane of FIG. 1a with a plane perpendicular to it.

Figure 1B:
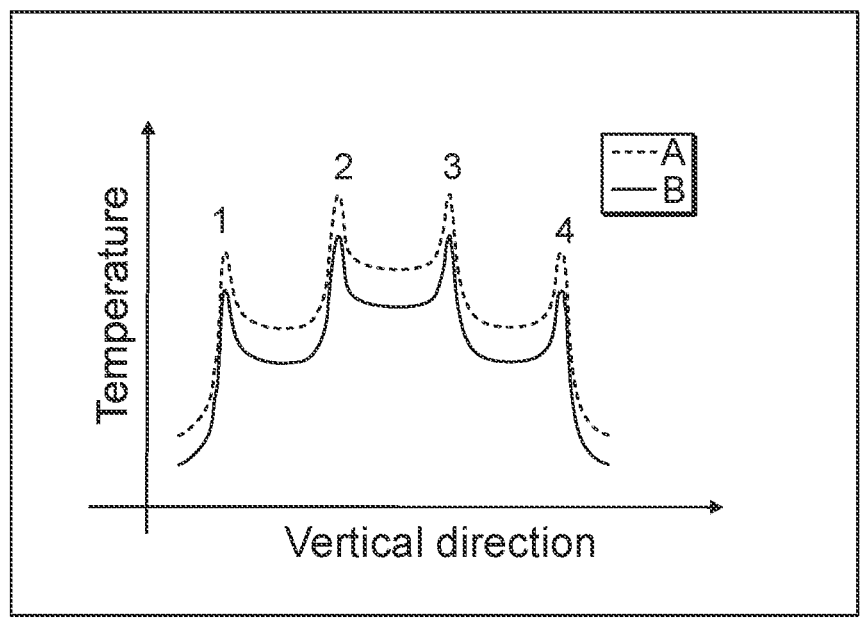
FIG. 1B provides an example temperature distribution in a HEMT similar to the HEMT of FIG. 1A, as predicted by numerical modeling. The temperature distribution is taken along each of the cut-lines A and B of FIG. 1A.

In FIG. 1B, there is shown a temperature distribution predicted by numerical modeling. The temperature distribution is taken along each of the cut-lines A and B of FIG. 1A. The observer's view in reading the temperature profiles is taken from the right-hand side of FIG. 1A, looking toward the left.

It will be seen in the figure that the temperature reaches a local peak in the vicinity of each of the four gate fingers. That is to be expected, since most of the heat is dissipated in the channel area near the gate. It will also be seen that the temperature at the inner gates (i.e., gates 2 and 3) is higher than that at the outer gates (i.e., gates 1 and 4), which we attribute to less efficient heat extraction at those positions.

The undesirable heating effect is further exacerbated because the thermal resistance of substrate material tends to increase with temperature, thus making the heat extraction even less efficient. Still further, there may be ten, twelve, or even more fingers in a high-power device. These high multiplicities of gate fingers further exacerbate the excess gate temperature in the middle of the device relative to the device periphery.

An important feature of the prior art device of FIGS. 1A and 1B, and of devices like it, is that the heat sources are distributed in straight lines parallel to rectilinear gates; in the view of FIGS. 1A and 1B, for example, they are distributed from left to right along the horizontal.

Figure 2A:
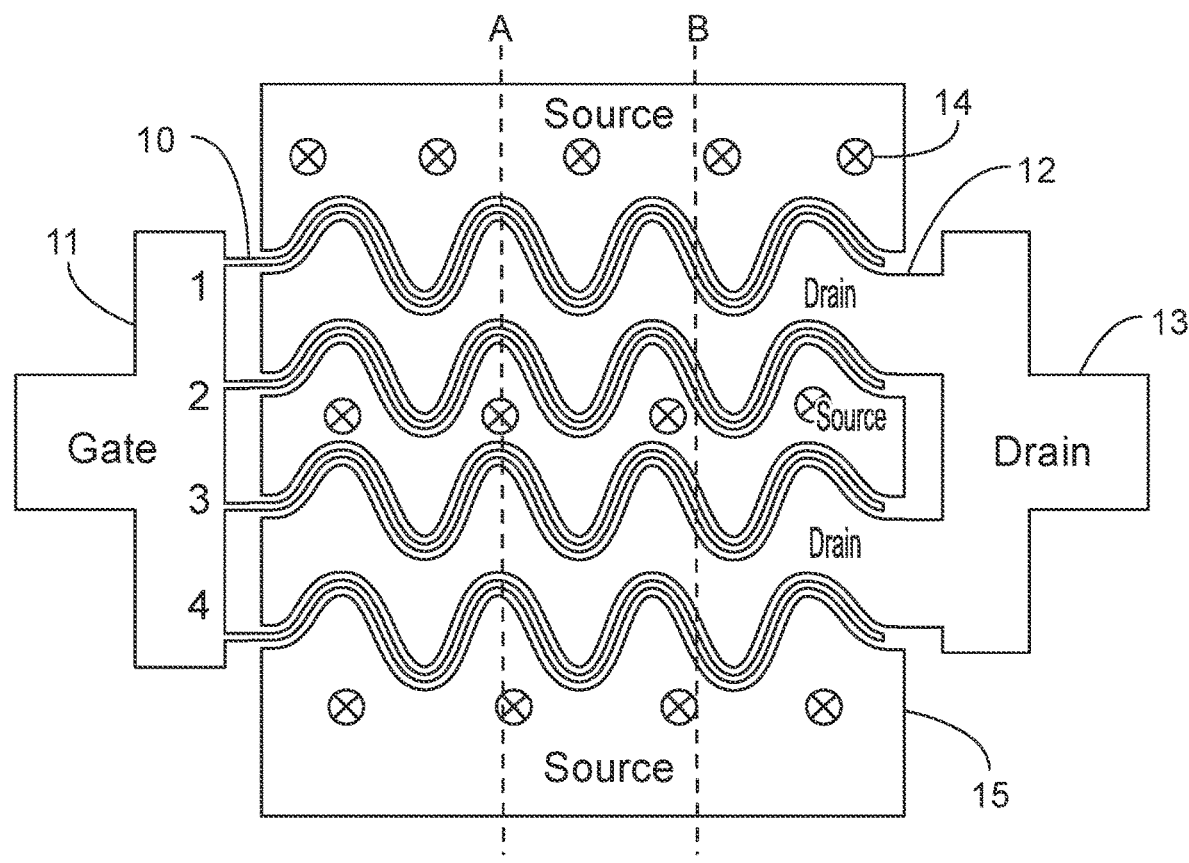
FIG. 2A is a notional plan view of an example HEMT in which, in accordance with certain of the ideas presented here, the rectilinear gates are replaced by gates having a meandering configuration.

FIG. 2A is a notional plan view of an example HEMT in which the rectilinear gates are replaced by gates having a meandering configuration. In the example of FIG. 2A, the meandering shape is constituted by S-shaped curves. Each S-shape is constituted by a pair of individual arcs, that are concave in opposite directions. (Below, arcs are also referred to as "half-loops" or as "turns".) This example is illustrative but should not be understood as limiting.

The heat sources in the configuration of FIG. 2A are still parallel to the gates. In part, the heat sources are distributed horizontally, i.e., from left to right in the view of the figure. Because of the meandering shape, however, they are also distributed vertically within the footprint of each gate finger. That is, they are distributed along the direction between top and bottom in the view of the figure.

Figure 2B:
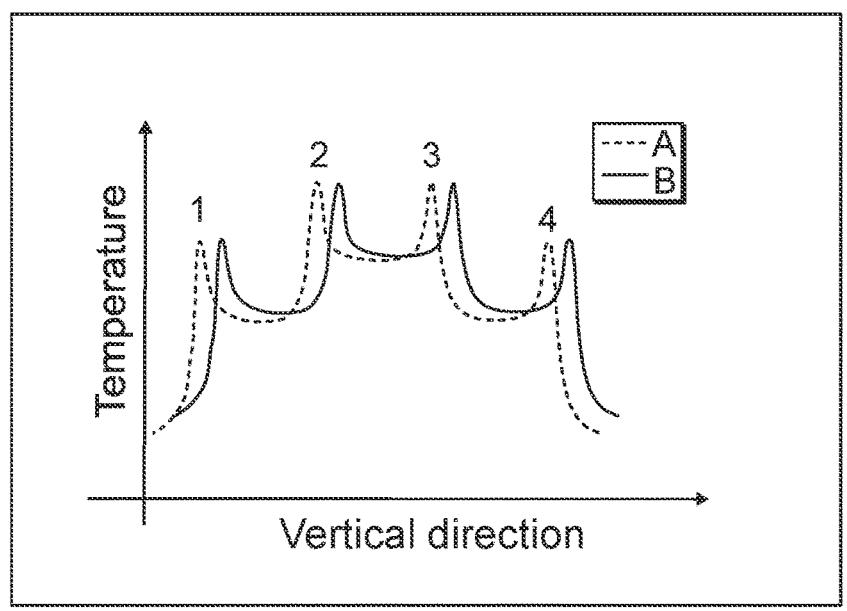
FIG. 2B provides an example temperature distribution along the cut-lines A and B of FIG. 2a, as predicted by numerical modeling.

Such a two-dimensional disposition allows heat to be extracted and dissipated more efficiently than in the uniaxial disposition of the prior art. For example, FIG. 2B shows a numerically modeled temperature distribution along the cut-lines A and B of FIG. 2A, which are similar to the cut-lines discussed above in regard to FIGS. 1A and 1B. With reference to FIG. 2B, it will be seen that the temperature still reaches a peak value at the gates, but the vertical variation in the gate position causes the peak positions along cut-line A to shift relative to the peak positions along cut-line B. This indicates that there is a temperature gradient in both the horizontal and vertical directions. Such a temperature gradient would lead to better heat extraction.

In fact, the meandering layout presents another design advantage in addition to the superior thermal dissipation explained above: Relative to a rectilinear gate, the total path length of a meandering gate contributes more periphery within the same physical separation between the gate and drain manifolds.

This is easily understood through a visual comparison between FIGS. 1A and 2A. As seen in the figures, the individual periphery (equivalently, the individual width) of a rectilinear gate (FIG. 1A) is simply the distance traversed by the gate from left to right across the mesa. However, the periphery of the meandering gate (FIG. 2A) exceeds the straight-line distance. It depends on the peak-to-peak distance and on the periodicity of the meandering path.

One important consequence is that because the periphery of each individual gate is increased, it is possible to reduce the number of fingers without reducing the total periphery. Even without other adaptations, this can help to mitigate the temperature rise at the inner gates.

Further, using meandering gates can reduce the gate inductance, relative to a rectilinear gate of the same periphery. That is because the direction of current flow has opposing vertical components in oppositely directed turns. There is mutual cancellation between the magnetic fields induced by these opposing components.

Figure 3A:
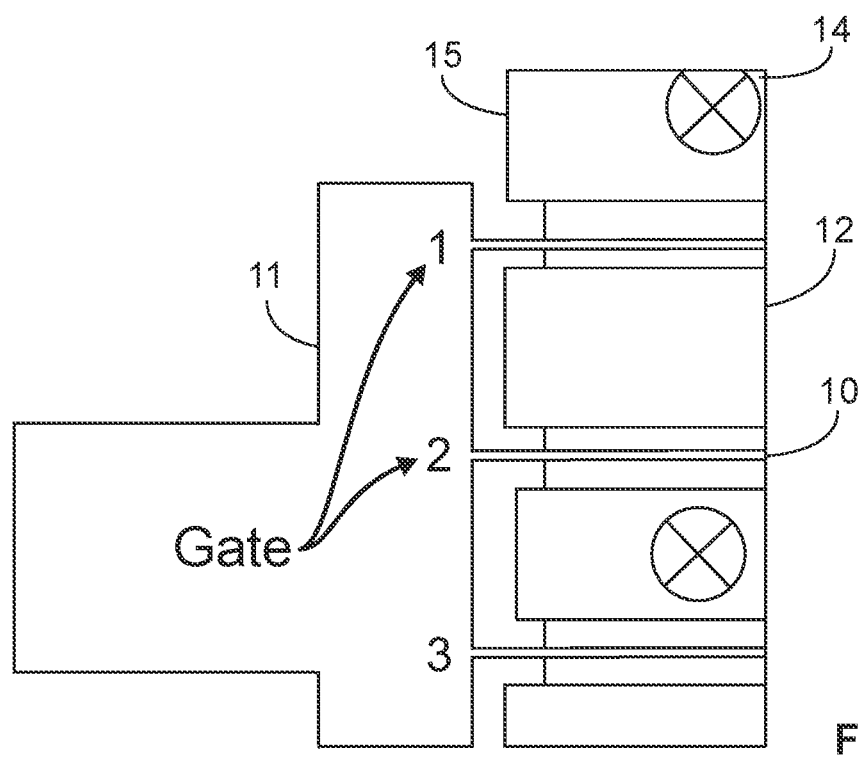
FIG. 3A is a drawing of a conventional T-shaped gate manifold. As shown in the figure, there is a longer signal path to gate finger 1 than to gate finger 2.

The design of the gate pad or gate manifold also has a significant effect. FIG. 3A shows a conventional T-shaped gate manifold. It will be apparent, on examining the figure, that as the number of gate fingers increases, the size of the pad will increase along with it. One consequence is that the signal paths to the respective individual gate fingers become unequal.

For example, FIG. 3A shows a longer signal path to gate finger 1 than to gate finger 2. This added pathlength adds inductance, and it also causes a phase mismatch between the gate fingers. Both of these factors can impair high-frequency device performance.

Figure 3B:
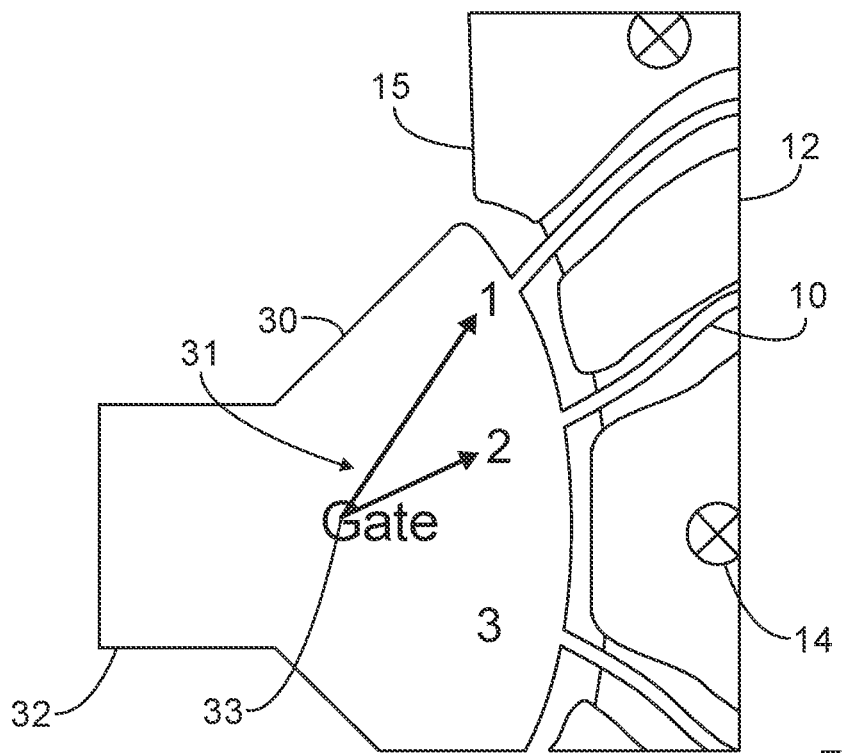
FIG. 3B is a drawing of a radial design for the gate manifold according to certain of the ideas presented here. As shown in the figure, the signal pathlengths to the respective fingers can be equalized in this design.

FIG. 3B shows a new radial design 30 for the gate manifold. The new design provides a solution to the problem of phase mismatch. As seen in the figure, the signal pathlengths to the respective fingers can be equalized in this design.

The gate manifold of FIG. 3B includes a transition region 31 between the end of the feedline 32 and the beginnings of the gate fingers. As shown, the gate fingers all radiate from a focal point 33 within the transition region. There is a point within the transition region that we refer to as the "foot" of the gate manifold.

More specifically, the transition region referred to above is the region where changes in the local distributed values of capacitance and inductance mark the end of the feedline, but where the influence of the individual gate fingers is not yet felt.

The foot of the gate manifold provides a nominal signal launch point which is a useful point of reference for discussing the signal pathlength through the gate fingers.

Below, we will use the term signal launch region to refer to the nearby environment surrounding the foot of the gate manifold.

It will be apparent from an examination of FIG. 3B that if the gates are not meandering, the radiating arrangement of gate fingers will cause the outer gates to be wider than the inner gates. That is, it will cause the outer gates to have a greater total path length across the mesa. This will clearly be the case if, for example, the gates are all simple circular arcs.

This may be acceptable for some applications, particularly at lower frequencies and correspondingly longer wavelengths.

However, the end-to-end propagation time for gate voltage signals launched from the gate manifold will generally be different for gates having different lengths. This can result in mismatches in phase delay among the various gate fingers. These mismatches might be unacceptable for some applications, particularly at the highest frequencies of interest.

This problem is resolved by designing the meandering shapes differently for the different gate fingers in such a way that the effective gate widths are substantially equalized.

Figure 4:
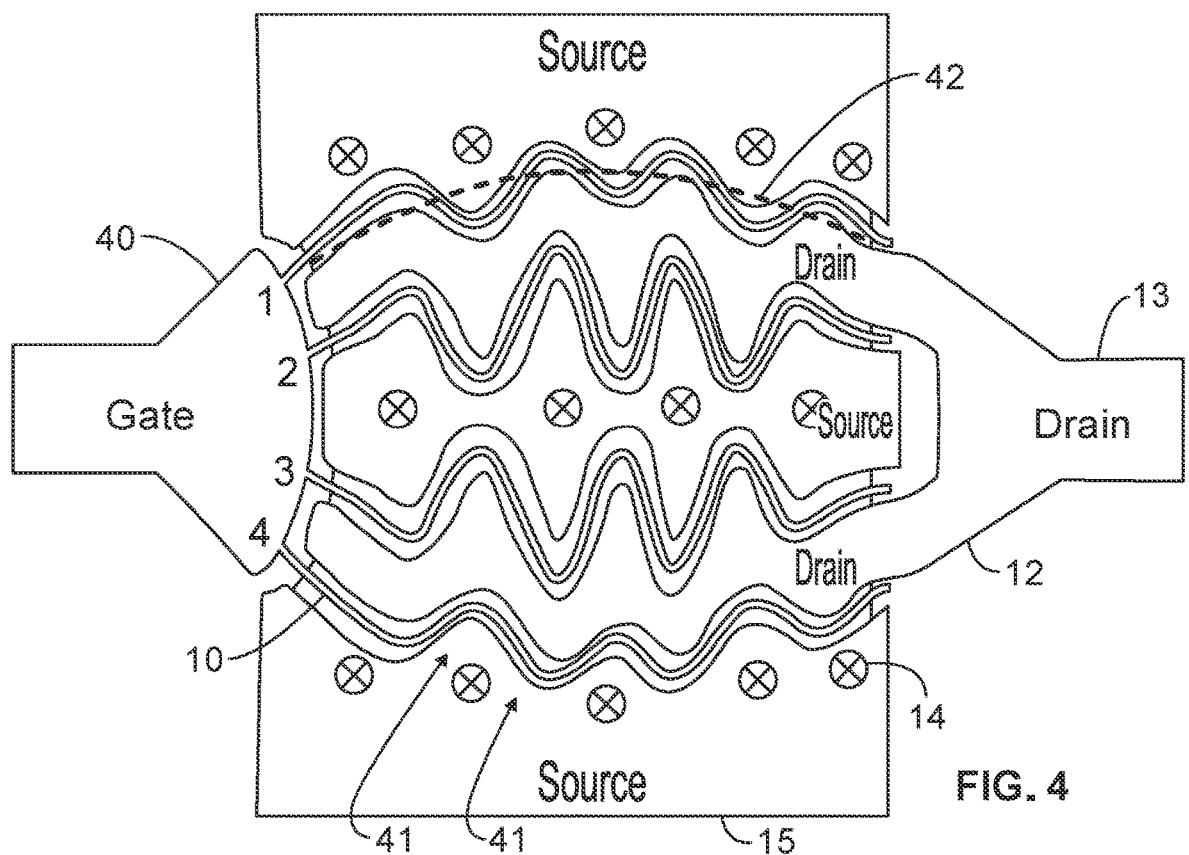
FIG. 4 is a notional plan view of a HEMT with meandering gates according to certain of the ideas presented here. In the layout of FIG. 4, the radial gate manifold is designed to maintain phase matching between the individual fingers.

FIG. 4 is a notional plan view of a HEMT with meandering gates as described above. In the layout of FIG. 4, the radial gate manifold 40 is designed to maintain phase matching between the individual fingers. Each of the gates has a central course that follows a curve across the device mesa from the gate manifold to the end of the gate finger. The dotted line 42 in the figure symbolically indicates an example of such a central course. However, each gate meanders in a plurality of arcs 41 about the central course. In examples, these arcs are periodic or quasiperiodic with path length along the central course. In examples, the arcs are sinusoidal in shape. In examples, each arc has a respective amplitude and a respective period, either or both of which may be varied as a function of position.

The design flexibility offered by our new approach can be exploited to distribute heat more evenly over the device area and thereby reduce the channel temperature. It can also be exploited to minimize the feed inductances and thereby improve power density and RF performance.

In an example layout, the central courses are curved as shown, for example, in FIG. 4. In such a layout, the central portion of each gate finger may oscillate sinusoidally about its central course. As shown in FIG. 4, the gate manifold 40 may be shaped in an arc to equalize the propagation length from the signal launch point to the start of each of the respective gate fingers.

Additionally, the oscillations of the gate fingers about their respective central courses may be varied to further equalize the respective propagation lengths. These variations may be variations in amplitude, variations in frequency, or variations in a combination of the two.

Fabrication

The gate, source and drain are formed by metal depostion.

In examples, the source and drain have the same metal stack and are deposited concurrently using a suitably patterned mask. The gate metal, which may be different from the source and drain metal, is deposited in a separate process step using a different mask. The patterning for the source and drain is dictated by the patterning for the gate.

Example

In this example, the thermal performance is compared between a gate with parallel straight-line fingers, and a gate in which the fingers meander about a central course that is a straight line.

We numerically modeled the thermal response of a GaN wafer 300 μm wide, 300 μm long, and 60 μm thick. The gate fingers were modeled as six parallel straight lines spaced 15 μm apart with a gate width of 120 μm. An input power of 10 W was assumed to be utilized with an efficiency of 65%, so that 35%, or 3.5 W, was dissipated as heat. The total periphery, i.e. the product of the number of gates times the gate width, was 7200 μm. The active area, i.e. the area directly under the gates, had an area of 9000 μm².

Figure 5:
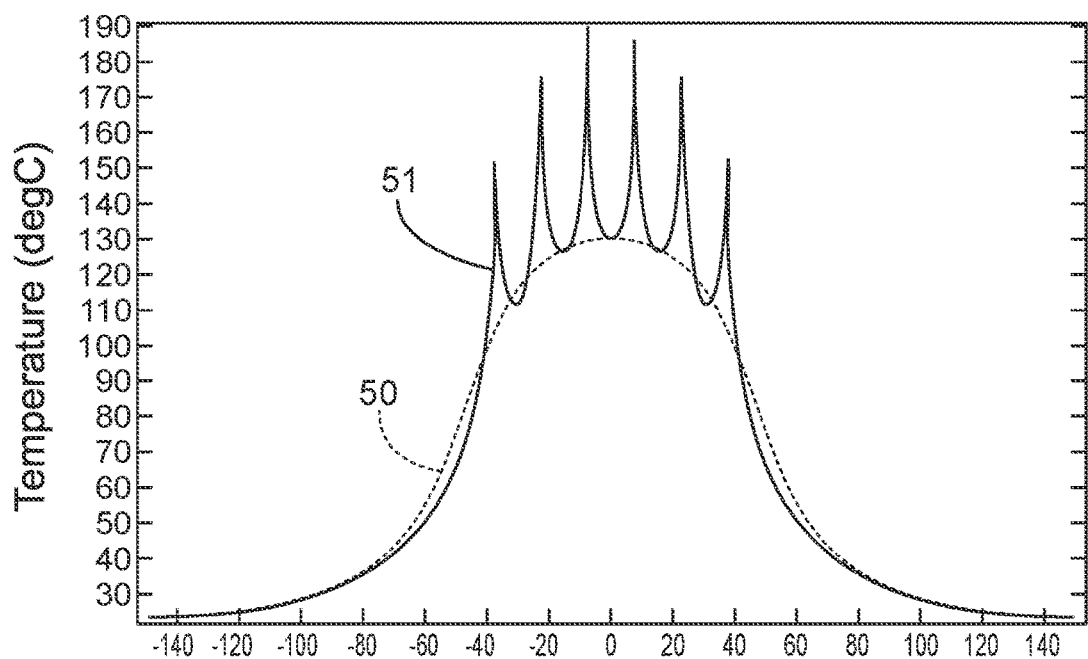
FIG. 5 shows example steady-state surface temperature profiles in a HEMT of conventional design. The illustrated temperature profiles are on the centerline parallel to the fingers and on the centerline perpendicular to the fingers.

FIG. 5 shows the steady-state surface temperature profile on the centerline parallel to the fingers (smooth curve 50) and on the centerline perpendicular to the fingers (multi-peaked curve 51). The predicted peak temperature was 194° C.

For comparison, we modeled the thermal response of the same wafer to an array of four gate fingers occupying the same active area as above and having the same total device periphery as above. Each gate finger was designed as a pure sine curve with a period of 48 μm. Power dissipation was the same as above.

Figure 6A:
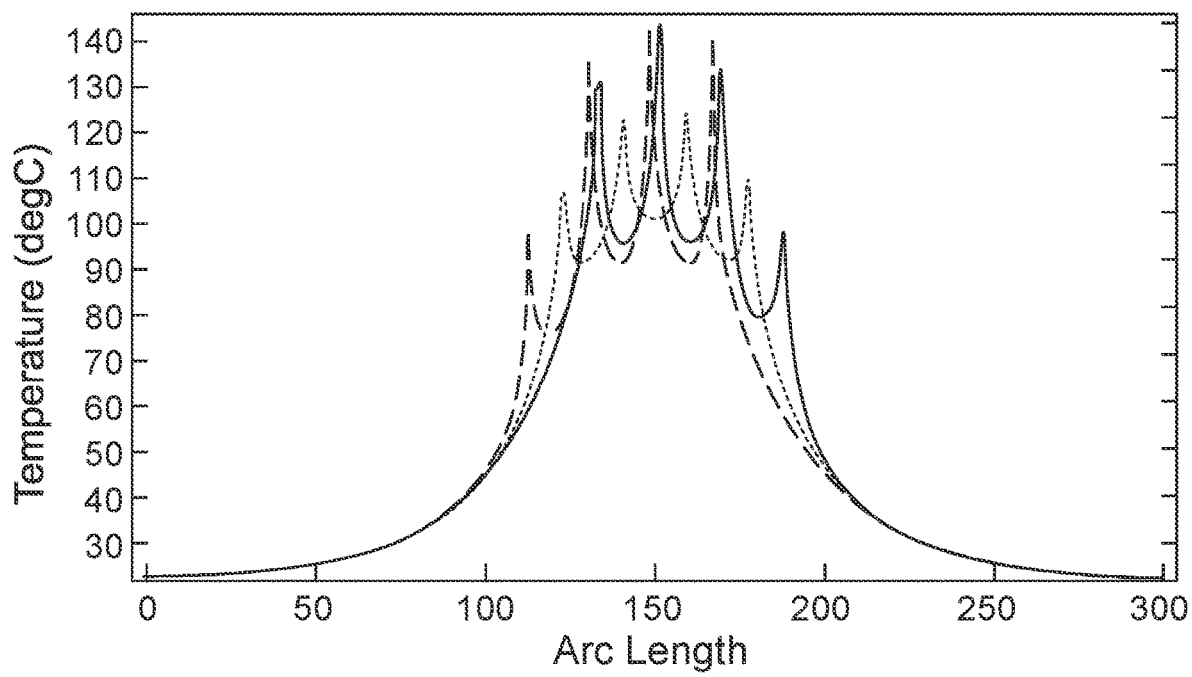
FIGS. 6A and 6B show example steady-state surface temperature profiles in a HEMT having meandering gates according to certain of the ideas presented here.
Figure 6B:
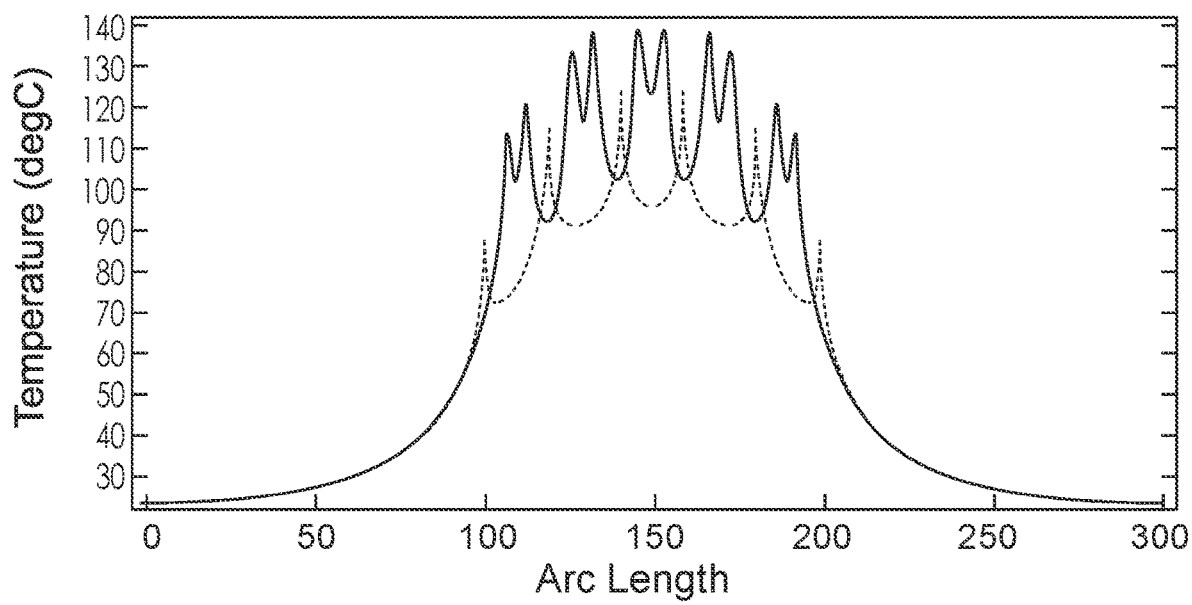

FIG. 6A shows three steady-state surface temperature profiles taken respectively on different cut-lines running in the vertical direction of FIG. 2A. FIG. 6B shows the steady-state surface temperature profile taken respectively on different cut-lines running in the horizontal direction of FIG. 2A. The predicted peak temperature was 145° C. In both figures, the steady-state temperature was plotted as a function of arc length along the cut-line.

The invention claimed is:

1. A transistor, comprising a substrate having an active area, a gate manifold formed on the substrate, and three or more gate fingers extending across the active area from the gate manifold, wherein the gate manifold has a curved edge, and each of the gate fingers projects radially from the curved manifold edge.

2. The transistor of claim 1, wherein at least one of the three or more gate fingers has a meandering shape that comprises at least one arc.

3. The transistor of claim 1, wherein each of the gate fingers has an effective length from a foot of the gate manifold to a finger end distal to the gate manifold, and all of the three or more gate fingers have substantially the same effective length.

4. The transistor of claim 3, wherein each of the three or more gate fingers has a meandering shape that comprises at least one arc.

5. The transistor of claim 4, wherein the meandering shape of at least two gate fingers comprises a plurality of arcs described about a curved central course.

6. The transistor of claim 4, wherein the meandering shapes of the gate fingers comprise sinusoidal arcs.

7. The transistor of claim 4, wherein the meandering shapes of the gate fingers comprise sinusoidal arcs, and the sinusoidal arcs of at least one gate finger are amplitude modulated.

8. The transistor of claim 4, wherein the meandering shapes of the gate fingers comprise sinusoidal arcs, and the sinusoidal arcs of at least one gate finger are frequency modulated.

9. The transistor of claim 4, wherein the meandering shapes of the gate fingers comprise sinusoidal arcs, and the sinusoidal arcs of at least one gate finger are modulated in both frequency and amplitude.

* * * * *